(12) United States Patent
Campardo et al.

(10) Patent No.: US 7,616,515 B2
(45) Date of Patent: Nov. 10, 2009

(54) INTEGRATED ELECTRONIC DEVICE HAVING A LOW VOLTAGE ELECTRIC SUPPLY

(76) Inventors: Giovanni Campardo, Via Rillosi, 9, I-24100 Bergamo (IT); Gian Pietro Vanalli, Via Cascine, 13A, I-24030 Almenno San Bartolomeo (BG) (IT); Pier Paolo Stoppino, Via Pergolesi, 23, I-20100 Milano (IT); Roberto Dossi, Viale Premuda, 4, I-20133 Milano (IT); Aldo Losavio, Via Palma il Vecchio, 16/B, I-24100 Bergamo (IT)

( * ) Notice: Subject to any disclaimer, the term of this patent is extended or adjusted under 35 U.S.C. 154(b) by 125 days.

(21) Appl. No.: 11/401,523

(22) Filed: Apr. 11, 2006

(65) Prior Publication Data
US 2007/0019492 A1 Jan. 25, 2007

(30) Foreign Application Priority Data
Apr. 11, 2005 (IT) .......................... MI2005A0607

(51) Int. Cl.
*G11C 5/14* (2006.01)
(52) U.S. Cl. .................. 365/226; 365/185.33; 365/148; 365/149
(58) Field of Classification Search .................. 365/226, 365/185.33, 148, 149
See application file for complete search history.

(56) References Cited

U.S. PATENT DOCUMENTS

| | | | | |
|---|---|---|---|---|
| 5,471,087 A | * | 11/1995 | Buerger, Jr. | .................. 257/532 |
| 5,874,849 A | * | 2/1999 | Marotta et al. | .............. 327/536 |
| 6,198,685 B1 | * | 3/2001 | Sudo et al. | ............. 365/230.06 |
| 6,240,037 B1 | * | 5/2001 | Kuwabara | .................... 365/228 |
| 6,278,639 B1 | * | 8/2001 | Hosono et al. | ......... 365/189.09 |
| 6,608,782 B2 | * | 8/2003 | Hirano | .................. 365/189.09 |
| 6,744,669 B2 | * | 6/2004 | Jahanshir et al. | ....... 365/185.19 |
| 6,768,688 B2 | * | 7/2004 | Mihara | .................. 365/189.11 |
| 6,901,009 B2 | * | 5/2005 | Natori | .................... 365/185.18 |
| 6,912,155 B2 | * | 6/2005 | Sakurai et al. | ......... 365/185.02 |
| 7,085,190 B2 | * | 8/2006 | Worley et al. | .......... 365/230.06 |
| 2003/0179550 A1 | * | 9/2003 | Nebrigic et al. | ............. 361/729 |
| 2004/0052151 A1 | * | 3/2004 | Jacobs et al. | ................. 365/233 |
| 2006/0082351 A1 | * | 4/2006 | Martins et al. | .............. 323/268 |

\* cited by examiner

*Primary Examiner*—Son Dinh
*Assistant Examiner*—Nam Nguyen
(74) *Attorney, Agent, or Firm*—Trop, Pruner & Hu, P.C.

(57) ABSTRACT

An integrated electronic device includes at least one supply pin and at least one booster coupled to said at least one supply pin. Moreover, there is at least one integrated circuit powered by the at least one booster and associated therewith in a "system in a package configuration."

11 Claims, 4 Drawing Sheets

| IN VOLTAGE SUPPLY | CORE VOLTAGE SUPPLY | OUT VOLTAGE SUPPLY | FIGURE NUMBER |
|---|---|---|---|
| 1.8V | 3V | 1.8V | 3 |
| 1.8V | 1.8V | 1.8V | 4 |
| 3V | 1.8V | 3V | 5 |
| 3V | 3V | 3V | 6 |
| 0.9V | 1.8/3V | 0.9V | 7 |

INTEGRATED ELECTRONIC DEVICE HAVING A LOW VOLTAGE ELECTRIC SUPPLY

FIELD OF THE INVENTION

The present invention relates to a low supply voltage integrated electronic device. The invention particularly, but not exclusively, relates to a "Flash" memory device comprising a memory, structured with a plurality of cells organized in matrix and representing a core, distinct from the other components for a different supply voltage, and the following description is made with reference to this field of application by way of illustration only.

BACKGROUND OF THE INVENTION

As it is well known, recently portable electronic devices have been the driving force behind development in the electronic field. In particular, in recent times research has embarked on the reduction of the supply voltage of electronic devices used in applications to increase the duration of battery operation. Naturally, since not all the components scaled in supply starting from a same voltage are available on an electronic device board, today many devices are realized using different supply voltages.

In particular, for memory electronic devices the supply voltage of the outputs (output buffers) and of the inputs (input buffers), generally indicated as VDDQ, is maintained separated from the supply voltage of the memory core, indicated with VDD.

This choice allows maintaining the loads of the outputs unaltered, thus avoiding a request for different technology approaches both by the client using memory devices, who, otherwise, should realize boards with more controlled capacitances, resistances and inductances, and by the component builder who, otherwise, should consider the test machines currently used.

The last years have shown the passage from memory devices supplied with 24V to those supplied with 12V and, more recently, to supplies with 5V, to now current devices supplied with 3V.

Let's now analyze a "Flash" memory electronic device, shown, for example, in the schematic block diagram of FIG. 1. Naturally, similar considerations can be made on all the devices wherein the supply voltage is to be scaled.

The "Flash" memory device, globally indicated with 1, has a first supply voltage VDD used to supply a core block 2 which, in general, comprises decoders, reading circuits, boosters and a memory comprising a plurality of memory cells organized in matrix. In addition, the device 1 has a second supply voltage VDDQ, which suitably supplies an output buffer 3 and an input buffer 4.

Advantageously, the separation introduced between the two supply voltages VDD and VDDQ serves to avoid possible noise produced by the switching of the outputs of the output buffer 3 and of the input buffer 4 that affects the functionality of the components of the core block 2 and in particular of the core components.

Several problems arise when making the "Flash" memory devices work with a first supply voltage applied at the input VDD of about 0.9V as required, as per current requests. In particular, in the decoder circuits comprised within the core block 2 of the device 1. They need high voltage transistors, since "Flash" memory cells operate with voltage values being much higher than the value of 0.9V, on the order of about 10V. In order for the decoders to work quickly, at least for the reading operations, transistors would be required having a very low threshold but with a thick oxide for the writing and erasing operations. Naturally, the two requests are in conflict with each other.

Considering further components of the block 2, such as the reading circuits, they allow applying predetermined voltage values to a decoded memory cell making it operative. This operation requires a current-voltage conversion which, however, typically needs voltage stability and, simultaneously, a predetermined voltage value sufficient for making the conversion. Naturally, the requested low voltage supply values, such as 0.9V, need a greater accuracy and precision in the components used.

Current memory devices comprise, inside the block 2, inner boosters obtained by way of charge pumps with stages formed by diodes and capacitors that allow generating the different voltages required by the components of the block 2. The low supply voltages, such as 0.9V, then require an increase of the number of the stages with a consequent area increase and loss of efficiency or a decrease of the output resistance of the charge pump.

The core or the matrix of the "Flash" memory device being supplied with voltages equal to 0.9V requires the use of low threshold voltage transistors to avoid the slowdown of the operations to be performed.

Let's now take some possible memory device configurations further by considering the functionality of the supply voltages VDD and VDDQ. We refer to five different configurations summarized in the table of FIG. 2 and represented by way of schematic block diagrams in FIGS. 3 to 7.

In the first case, shown in FIG. 3, the core block 2, of the "Flash" memory device 1 is supplied by a voltage equal to about 3V while the supply voltage of the output buffer 3 and input buffer 4 is equal to about 1.5V. In this case, requiring a first supply voltage equal to about 0.9V a Step-up or booster 6 is interposed between the first supply voltage VDD and core block 2 allowing bringing the voltage at the input of the core to the necessary value of about 3V. While a second supply voltage VDDQ of about 18V directly supplies the output buffer 3 and input buffer 4.

In the second example shown in FIG. 4 a "Flash" memory device 1 has a core block 2 supplied by a voltage of about 1.8V similar to the supply voltage of the output and input buffers 3,4. In this case, requiring a first supply voltage equal to about 0.9V a Step-up block 6 is interposed between the first voltage VDD and the core block 2 which allows bringing the input voltage at the core block 2 to the necessary value of about 1.8V, while the second supply voltage VDDQ of about 1.8V directly supplies the input buffer 4 and output buffer 3.

Similar is the case shown in FIG. 5, wherein a "Flash" memory device 1 shows a Step up block 6 interposed between a first supply voltage VDD set at about 0.9V and the input of a core block 2 supplied by a voltage equal to about 18V, while a second supply voltage VDDQ of about 3V directly supplies the input buffer 4 and output buffer 3.

Also in the case of FIG. 6, a "Flash" memory device 1 has a Step-up block 6 interposed between a first supply voltage VDD of about 0.9V and an input of a core block 2 supplied with 3V, while a second supply voltage VDDQ directly supplies the input buffer 4 and output buffer 3 supplied with about 3V.

A different situation is reported for the example in FIG. 7 wherein a "Flash" memory device 1 has a core block 2 and an input buffer 4 supplied by a voltage of about 1.8V or 3V, while an output buffer 3 is supplied with about 0.9V. In this case, there will be a single supply voltage VDD which directly supplies the output buffer 3 and by way of the interposition of a Step up block 6 between the core block 2 and the input buffer 4.

The problem is that of providing a memory device having such structural and functional characteristics as to allow it to be supplied with low supply voltages, on the order of 0.9V, by using commercially available components and maintaining the compatibility of the output pins of a current memory device, overcoming the limits and/or drawbacks still affecting the devices realized according to the prior art.

SUMMARY OF THE INVENTION

The approach underlying the present invention is that of realizing an integrated electronic device, possibly comprising a memory, structured by way of a "system in package" with an inner booster.

On the basis of this approach the technical problem is addressed by a low supply voltage integrated electronic device as previously indicated and defined by the characterizing part of claim 1.

BRIEF DESCRIPTION OF THE DRAWINGS

The characteristics and the advantages of the electronic device of the invention will be apparent from the following description of an embodiment thereof given by way of indicative and non limiting example with reference to the annexed drawings. In these drawings.

DETAILED DESCRIPTION OF THE PREFERRED EMBODIMENTS

Figures 1, 2:
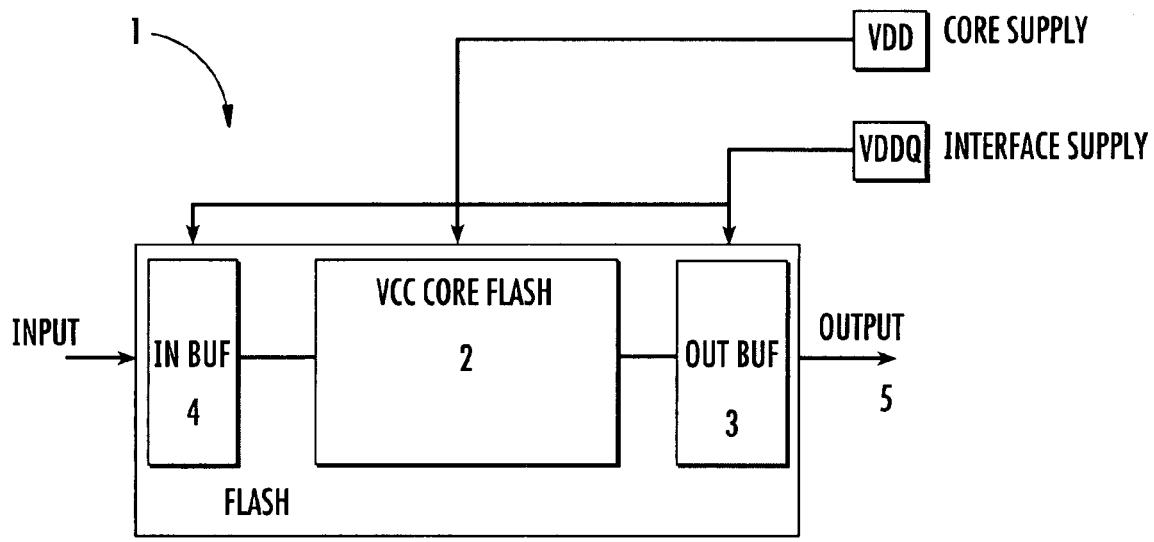
FIG. 1 is a schematic block diagram of a memory device realized according to the prior art.
FIG. 2 is a table reporting the supply voltages of five different possible configurations of known memory devices realized with commercially available components according to the prior art.
Figure 3:
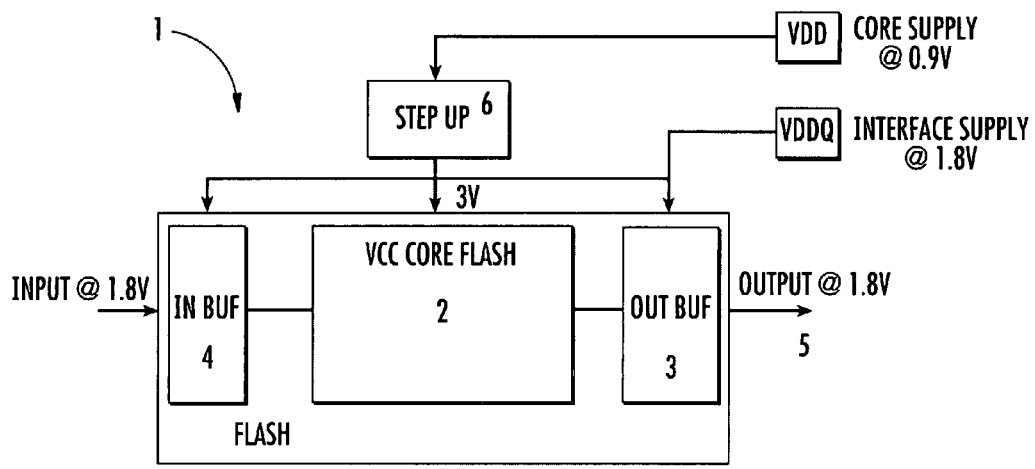
FIGS. 3 to 7 show the five different configurations of a memory device of the prior art and corresponding to the table of FIG. 2.
Figure 4:
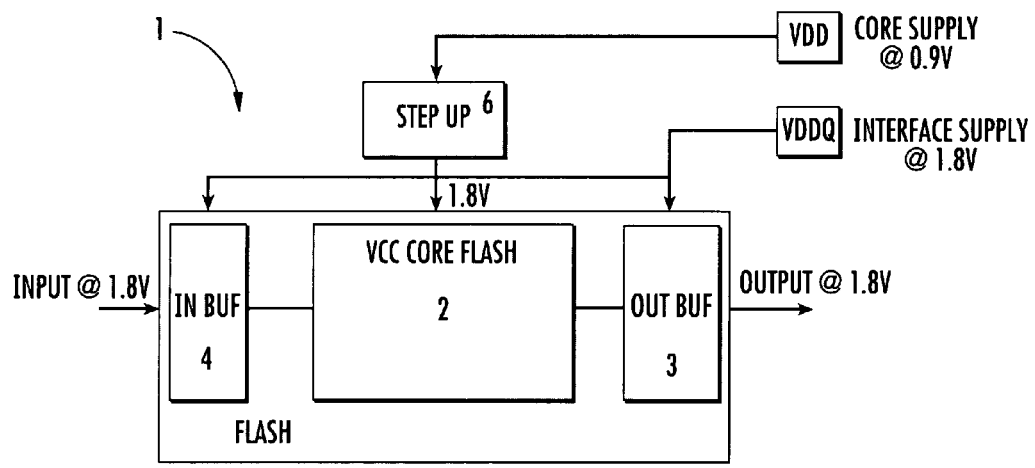
Figure 5:
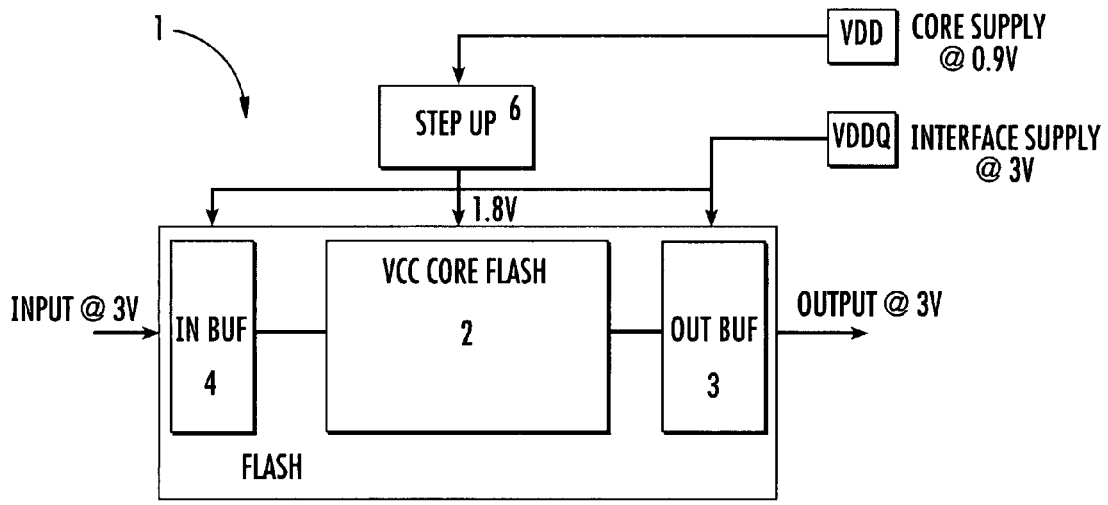
Figure 6:
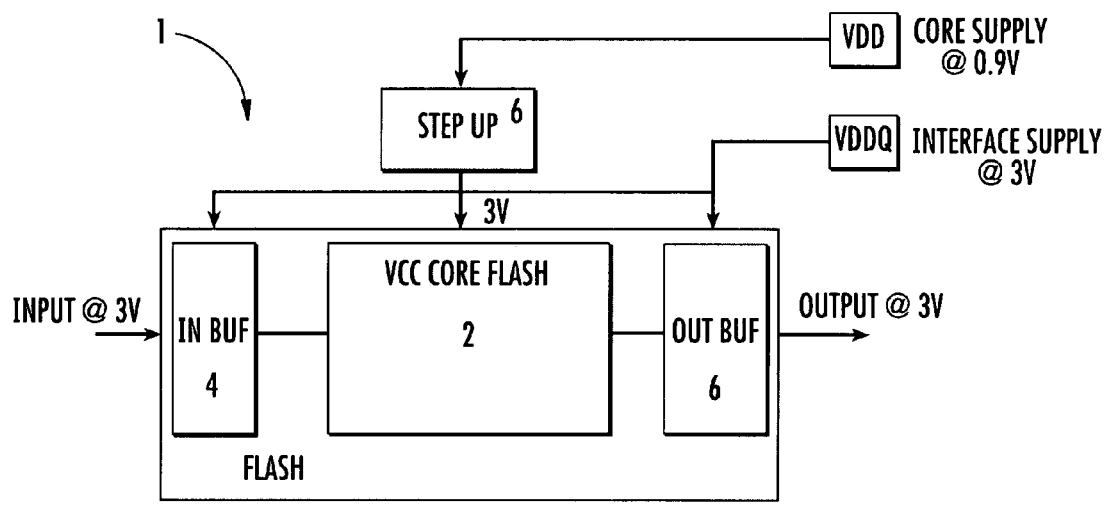
Figure 7:
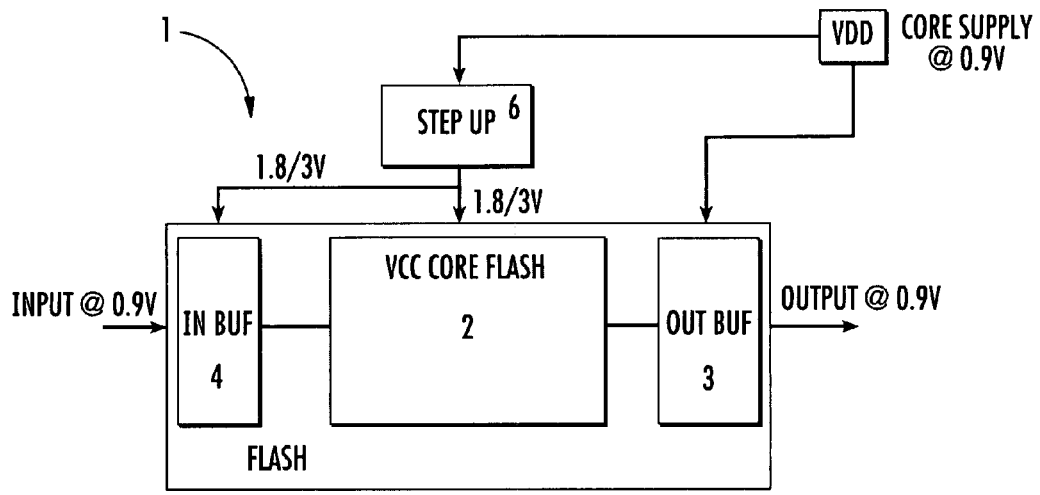
Figure 8:
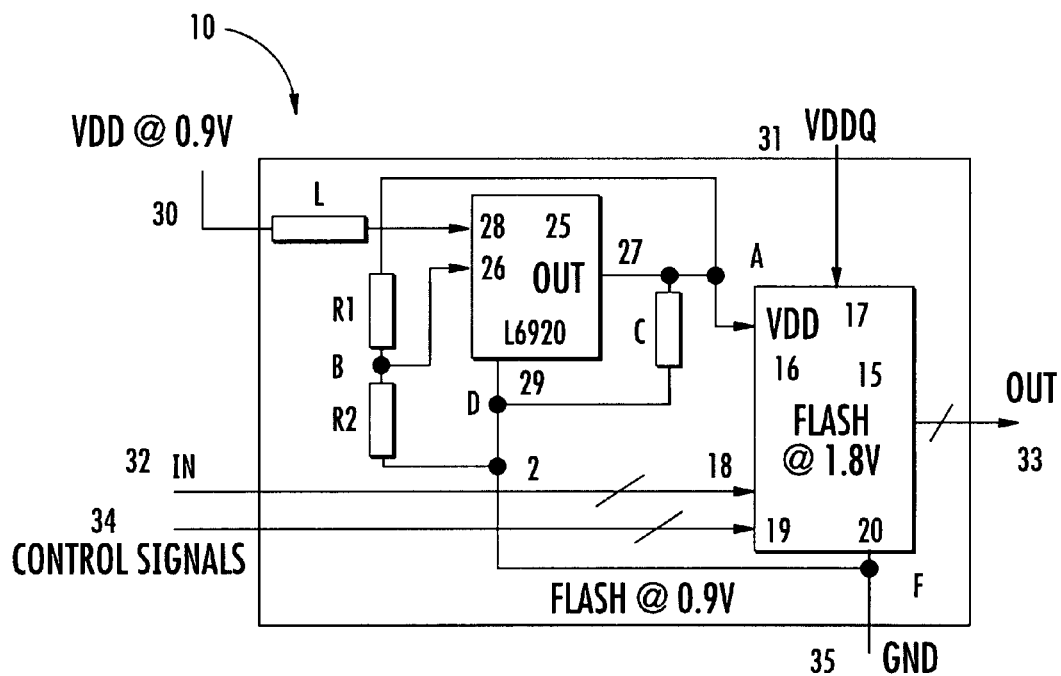
FIG. 8 shows an embodiment of memory device realized according to the present invention.

With reference to FIG. 8 a low supply voltage memory device is globally indicated with number 10. The memory device comprises a memory 15, for example of the Flash EEPROM type and comprising a matrix of nonvolatile memory cells, which represents the core of the Flash device, as well as suitable decoding and reading circuits associated with the matrix.

The device 10 comprises a first pin 30 and a second pin 31 for the connection to a first supply voltage source VDD and to a second supply voltage source VDDQ respectively. In the specific case described, the second pin 31 refers to a respective supply pin 17 of the memory 15. Naturally, between the source VDD and the input 17 one or more electronic components could be connected, without affecting the operation.

The device 10 comprises a first group of selection input pins 32 for the memory 15, a second group of pins 34 to receive control signals and a group of output pins 33. The pins 32 and 34 receive suitable signals coming from respective data, address and control buses and they refer to corresponding inputs 18 and 19 of the memory 15.

A further third supply pin 35 is provided for the connection to a reference voltage which, in the specific case, is a signal ground GND. This pin is associated with an input 20 of the memory 15.

In the specific case of the embodiment described, the memory 15 is of the type supplied with about 1.8V. Advantageously, the device 10 also comprises at least one booster 25, which is connected to the memory 15 in a layered structure of the "system in package" type.

According to a preferred embodiment, the device 1 is realized by way of a stacked die technology which allows assembling, in an extremely reduced thickness, the whole device 1 and in particular the booster 25 and the memory 15. In substance, it is a stack of integrated circuits being overlapped one onto the other in a same package in a "system in package" configuration.

The booster 25 is connected to the memory 15 and, in particular, to the core of the memory 15 by way of the interposition of a plurality of discrete components. In the embodiment indicated, a divider R1-R2 is interposed between a circuit node A, which is associated with a first supply input 16 of the core of the memory 15, and a circuit node D connected to the third pin 35 of the device 1 and thus to the ground node GND.

The circuit node B, intermediate to the divider R1-R2, is connected to a first input 26 of the booster 20. A capacitive component C is also interposed between a circuit node D and the circuit node A connected to the output 27 of the booster 20. Moreover, between the first pin 30 and a second input 28 of the booster 25, an inductive component L is interposed. The booster 25 also has a third supply input 29 directly connected to the circuit node D and thus to the ground voltage reference GND.

The device 10 thus realized is supplied by way of the first pin 30 by a supply voltage which is about 0.9V and it allows supplying, by way of the interposition of the booster 25, the core of the memory 15 with a voltage of about 1.8V. A low supply voltage memory device 10, about 0.9V, is thus obtained being package-like, i.e. realized by way of a layered structure of the "system in package" type and, moreover, maintaining a set of pins corresponding to one of the usual memory devices.

This naturally allows replacing the present device 10 in any application where a memory device is requested, with the remarkable advantage of requiring a supply voltage equal to about 0.9V and of having a package-like structure with extremely reduced thickness.

Through tests carried out by the Applicant, it has also been verified how the turn-on times of the package-like device 10 thus realized can be compared with the turn-on times of the core of the memory 15 of a usual memory device. Naturally, the proposed approach serves for several embodiments all within the same scope of protection. In particular, other approaches can have a core of the memory 15 being supplied with a different voltage value, for example equal to 3V, in this case suitable boosters may advantageously be used to allow a correct connection and/or different discrete components.

Moreover, a low supply voltage memory device could be realized by way of "system in package" by overlapping two or more boosters onto a memory.

The main advantage of a device 10 realized by way of the "system in package" is that of having an extremely reduced supply voltage VDD, equal to about 0.9V, and a set of pins being completely similar to the one of a usual memory device supplied with a higher voltage VDD. This naturally allows facilitating the use of the package-like device 10 in the current electronic applications with, in addition, the further significant advantage of needing a low supply voltage, equal to about 0.9V, so as to increase the operation time of the components wherein they are used. Moreover, the package-like memory device thus realized, comprising memory, booster and connection discrete components connected by way of "system in package" technology has the advantage of an extremely reduced thickness with respect to the usual memory devices, facilitating its assembly in any application.

Further, the package-like device thus realized allows addressing the possible problems of control, during the turn on of the memory device, of the supply voltages and of the power consumption linked to the memory device and to the load connected to the output. In fact, the package-like device thus realized allows passing this control onto the inner booster which, as per how it is conceived, already addresses them internally.

That which is claimed is:

1. A packaged device comprising:
   a package;
   at least one integrated circuit booster die within said package; and
   at least one integrated circuit memory die within said package powered by said booster die, said memory and booster dice being stacked within said package;
   said package including a first pin to be coupled to a voltage below that needed by memory die, said first pin connected to said memory die through said booster; and
   said package including memory package pins so that package can be used in a memory application.

2. A device according to claim 1, further comprising a plurality of discrete components; and wherein said memory die coupled to said booster die by said plurality of discrete components.

3. A device according to claim 2, wherein said plurality of discrete components comprises at least one voltage divider coupled between an input and an output of said booster die.

4. A device according to claim 2, wherein said plurality of discrete components comprises at least one capacitive component coupled between an output and an input of said booster die.

5. A device according to claim 2, wherein the plurality of discrete components comprises at least one inductive component coupled between a supply pin and an input of said booster die.

6. A device according to claim 1, further comprising a plurality of discrete components to couple said at least one booster die to supply pins.

7. A device according to claim 1, said memory die having a core; and wherein an output of said booster die is connected to the core of said memory.

8. A device according to claim 1, wherein said at least one booster die comprises a plurality of boosters coupled in series.

9. A method comprising:
   coupling an integrated booster die to at least one supply pin;
   coupling an integrated memory die to the at least one booster die;
   associating the booster die and memory die together in a stacked die package having memory package pins and conforming to the size of a conventional memory package;
   powering said memory die, with a voltage below a voltage needed by the memory die, using said booster die; and
   connecting said die package to a system using the memory package pins on the package such that said package can be plugged in the same way as a conventional memory package using a supply voltage lower than that used by conventional memory packages.

10. The method of claim 9, wherein the memory die comprises a core coupled to the booster die by a plurality of discrete components.

11. The method of claim 9, wherein the booster die comprises a plurality of boosters coupled in series.

* * * * *